US011291138B2

(12) United States Patent
Tung et al.

(10) Patent No.: US 11,291,138 B2
(45) Date of Patent: Mar. 29, 2022

(54) COOLING SYSTEM FOR SERVER

(71) Applicants: Inventec (Pudong) Technology Corporation, Shanghai (CN); INVENTEC CORPORATION, Taipei (TW)

(72) Inventors: Kai-Yang Tung, Taipei (TW); Hung-Ju Chen, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 1 day.

(21) Appl. No.: 16/892,564

(22) Filed: Jun. 4, 2020

(65) Prior Publication Data

US 2021/0289662 A1    Sep. 16, 2021

(30) Foreign Application Priority Data

Mar. 15, 2020  (CN) .......................... 202010178891.5

(51) Int. Cl.
| | | |
|---|---|---|
| *G06F 1/16* | (2006.01) | |
| *H05K 5/00* | (2006.01) | |
| *H05K 7/00* | (2006.01) | |
| *H05K 7/20* | (2006.01) | |
| *H05K 5/02* | (2006.01) | |
| *H05K 5/03* | (2006.01) | |

(52) U.S. Cl.
CPC ....... *H05K 7/20327* (2013.01); *H05K 5/0226* (2013.01); *H05K 5/03* (2013.01); *H05K 7/203* (2013.01); *H05K 7/20318* (2013.01)

(58) Field of Classification Search
CPC .......... H05H 7/20327; H05H 7/20318; H05H 7/203; H05H 7/2029; H05K 7/20327; H05K 7/20318; H05K 7/203; H05K 7/2029; H05K 5/0226; H05K 5/03
See application file for complete search history.

(56) References Cited

U.S. PATENT DOCUMENTS

| | | | | |
|---|---|---|---|---|
| 6,125,635 | A * | 10/2000 | Nomura .................. | F25B 21/04 |
| | | | | 62/3.2 |
| 10,015,905 | B2 * | 7/2018 | Watanabe ............. | H01L 23/473 |
| 10,152,096 | B1 * | 12/2018 | Chen ....................... | G06F 1/187 |
| 10,674,637 | B2 * | 6/2020 | Ishinabe ............. | H05K 7/20154 |
| 11,076,508 | B2 * | 7/2021 | Gao .................... | H05K 7/20745 |
| 2015/0062806 | A1* | 3/2015 | Shelnutt ............. | H05K 7/20309 |
| | | | | 361/679.53 |
| 2017/0212560 | A1* | 7/2017 | Tsai ......................... | F04D 1/06 |
| 2018/0070477 | A1* | 3/2018 | Saito .................. | H05K 7/20818 |
| 2019/0212793 | A1* | 7/2019 | Lin .................... | H05K 7/20354 |
| 2020/0079639 | A1* | 3/2020 | Kim ........................ | F25B 21/02 |
| 2020/0337176 | A1* | 10/2020 | Aoki .................. | H05K 7/20772 |

* cited by examiner

*Primary Examiner* — Anthony M Haughton
(74) *Attorney, Agent, or Firm* — Locke Lord LLP; Tim Tingkang Xia, Esq.

(57) ABSTRACT

The invention provides a cooling system for a server. The cooling system includes a casing and a first heat dissipation device. The casing includes a tank and a cover. The tank has an accommodation space. The cover is movably mounted on the tank, and the cover covers the accommodation space so as to form an airtight space with the tank. The first heat dissipation device is mounted on the cover and located within the airtight space of the casing.

10 Claims, 8 Drawing Sheets

COOLING SYSTEM FOR SERVER

CROSS-REFERENCE TO RELATED APPLICATIONS

This non-provisional application claims priority under 35 U.S.C. § 119(a) on Patent Application No(s). 202010178891.5 filed in China on Mar. 15, 2020, the entire contents of which are hereby incorporated by reference.

BACKGROUND OF THE INVENTION

Technical Field of the Invention

The invention relates to a cooling system, more particularly to a cooling system for a server.

Description of the Related Art

As server technology progresses, server can provide higher performance and, hence, more heat. In order to prevent the working temperature too high to damage internal electronic components, an effective option is to provide an immersion cooling, where the immersion cooling is a new type of cooling technology that the heat source is immersed in a dielectric liquid (hereinafter referred to as the "coolant") to directly absorb the heat generated therefrom. During the cooling process, the heat is transferred to the liquid coolant and the liquid coolant is transformed into a vapor coolant, and then the vapor coolant is condensed by a condenser located above the liquid coolant and the vapor coolant is condensed into the liquid coolant.

Since the condenser is typically placed above the liquid coolant, the maintenance personnel has to temporally remove the condenser to reach the heat sources immersed in the liquid coolant and to perform required maintenance processes. And during the maintenance processes, the vapor coolant will not be effectively condensed into the liquid coolant due to the removal of the condenser, thereby resulting in leakage of vapor coolant.

In addition, some place the condenser along the inner wall above the liquid level to leave a channel therebetween for maintenance, but the condensation efficiency of the condenser to the vapor coolant is reduced since the condenser is not placed in the middle area above the tank chamber.

SUMMARY OF THE INVENTION

The invention provides a cooling system capable of facilitating the maintenance process of heat sources while maintaining the condensation efficiency of the condenser.

The cooling system of the invention may further have a lateral condenser for condensing the vapor coolant during the maintenance process.

The cooling system of the invention may have a cover for preventing a space which accommodates the vapor coolant from being enlarged due to the arrangement of the condensers, and further reducing the loss amount of the vapor coolant during the maintenance process.

One embodiment of the invention provides a cooling system for a server. The cooling system includes a casing and a first heat dissipation device. The casing includes a tank and a cover. The tank has an accommodation space. The cover is movably mounted on the tank, and the cover covers the accommodation space so as to form an airtight space with the tank. The first heat dissipation device is mounted on the cover and located within the airtight space of the casing.

According to the cooling systems as discussed above, the first heat dissipation device is fixed on the cover, and the cover can be moved with respect to the tank, and thus the first heat dissipation device can be located right above the opening, or leave the place located above the opening as the cover is moved with respect to the tank. Therefore, the condensation efficiency of the vapor coolant can be increased when the first heat dissipation device is located right above the opening, and does not block or interfere the maintenance of the heat source located in the tank when the cover is moved away.

BRIEF DESCRIPTION OF THE DRAWINGS

The present invention will become more fully understood from the detailed description given hereinbelow and the accompanying drawings which are given by way of illustration only and thus are not limitative to the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the following embodiments are disclosed by the figures, and some practical details are described in the following paragraphs, but the present invention is not limited thereto. Furthermore, for the purpose of illustration, some of the structures and components in the figures are simplified, and wires, reference lines or buses are omitted in some of the figures.

Moreover, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 1:
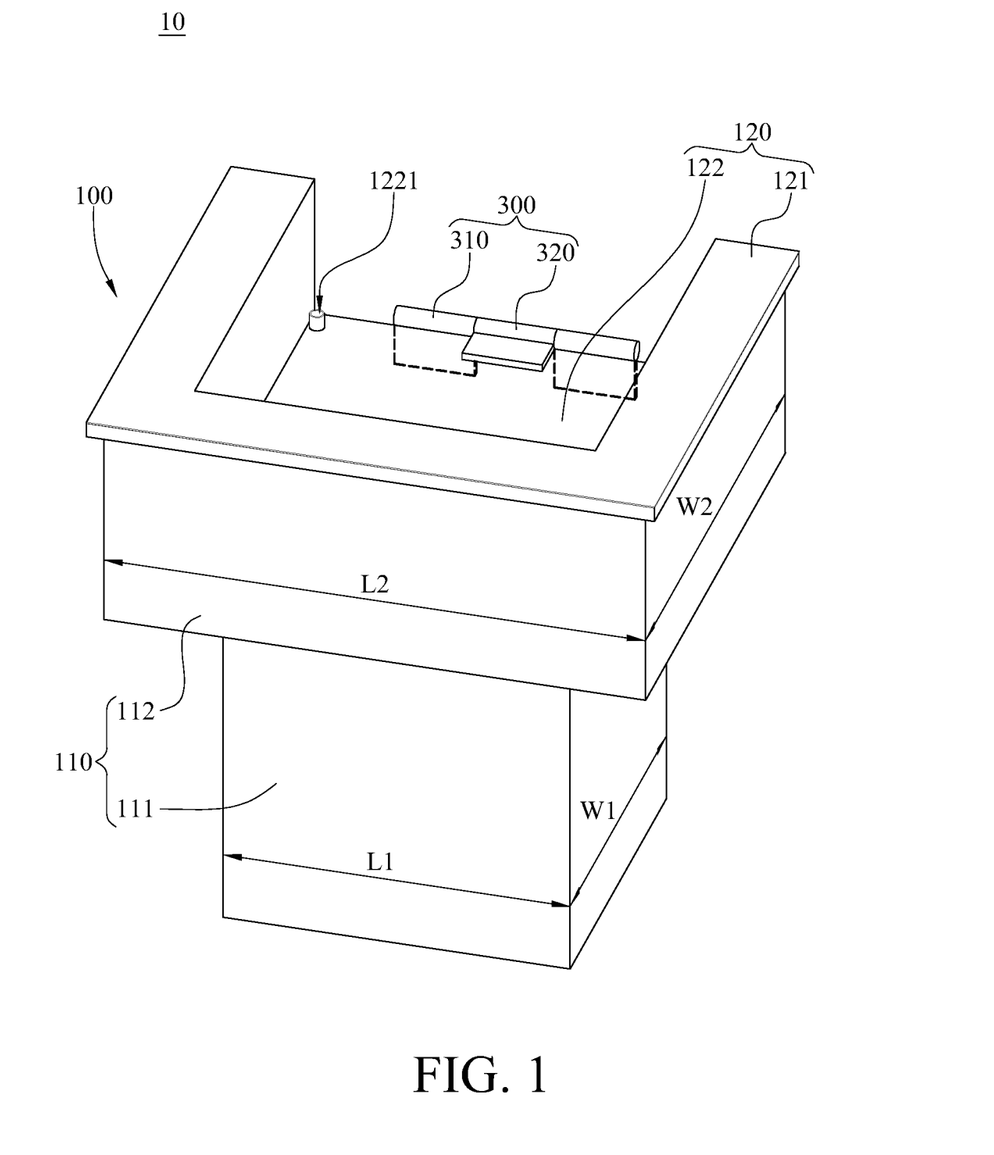
FIG. 1 is a perspective view of a cooling system according to a first embodiment of the invention.
Figure 2:
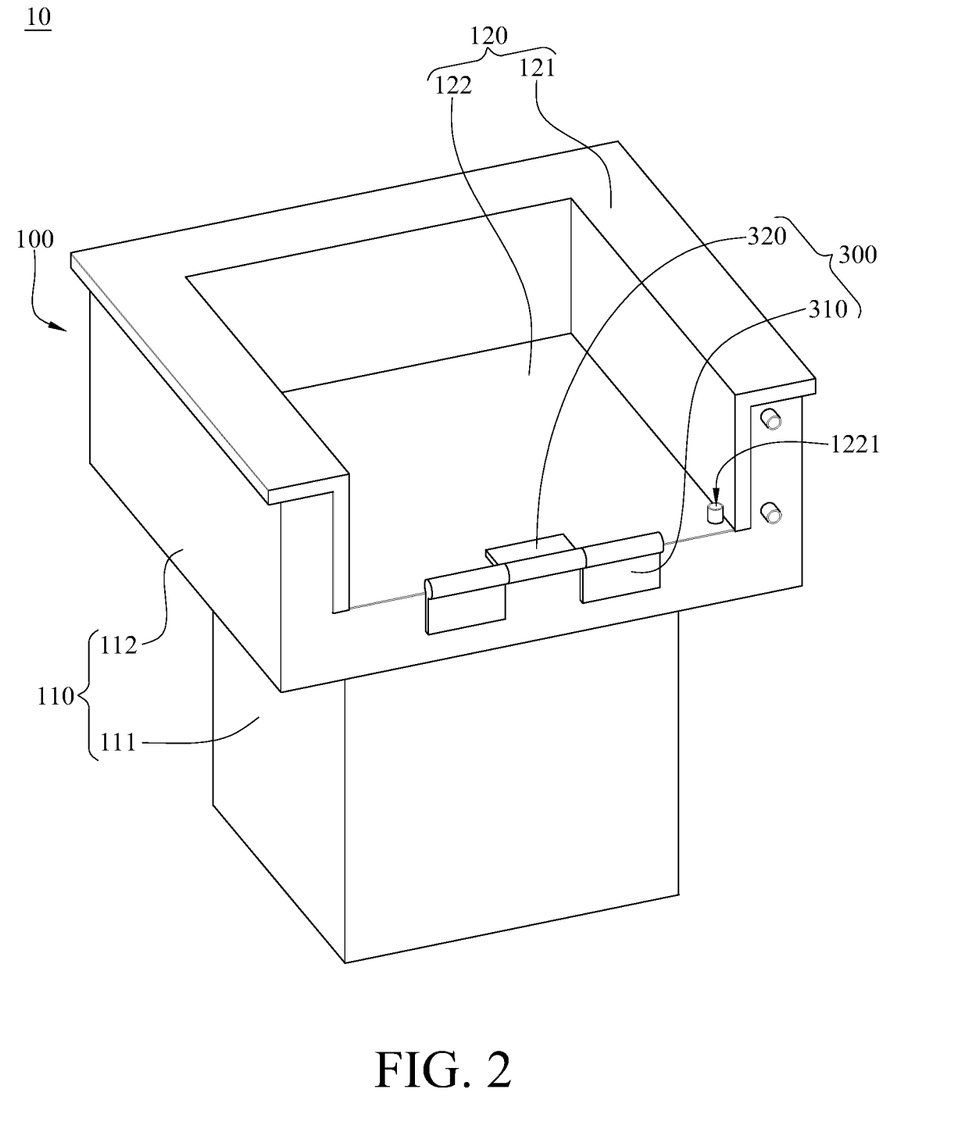
FIG. 2 is another perspective view of the cooling system in FIG. 1.
Figure 3:
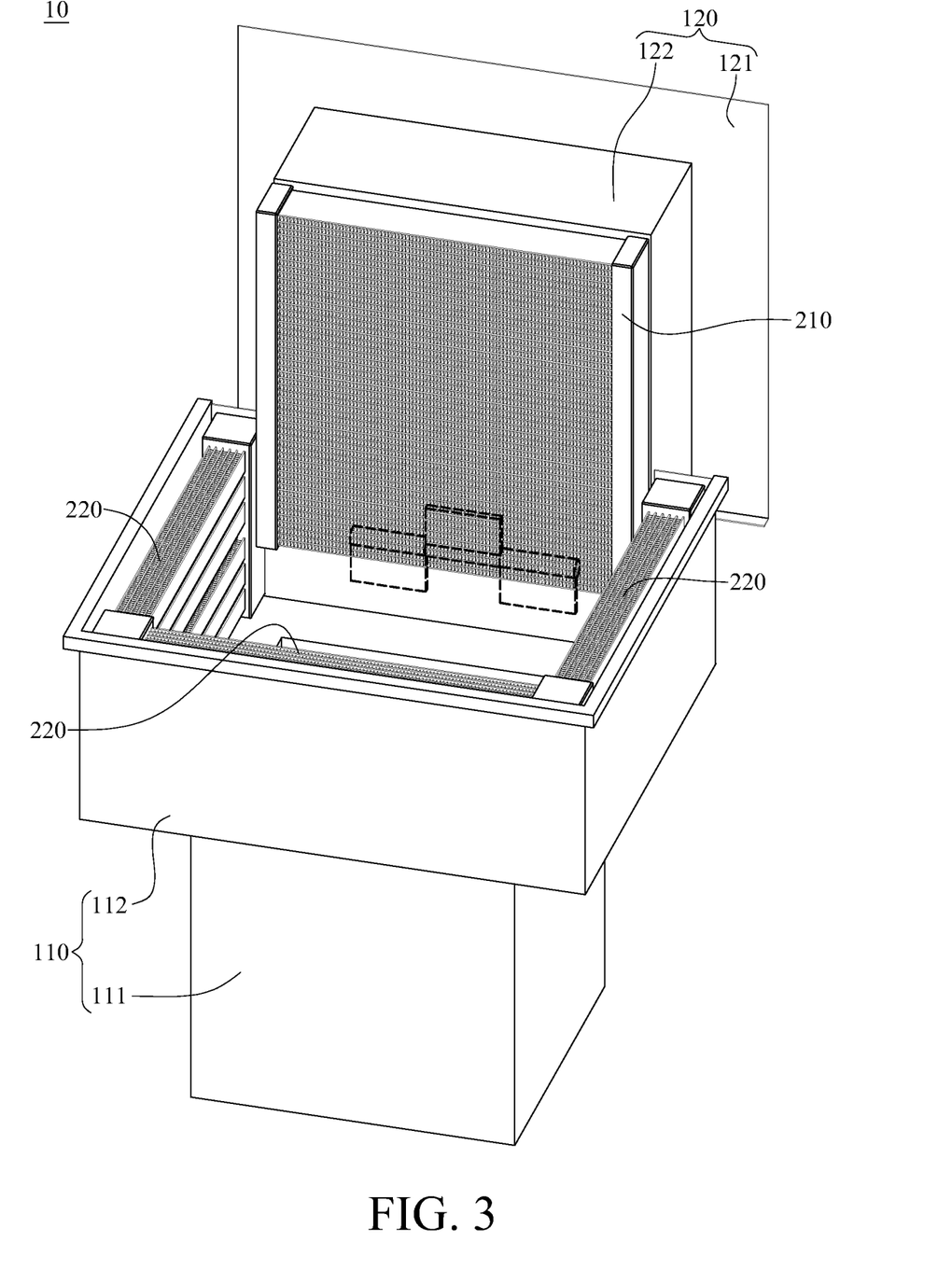
FIG. 3 is a perspective view of the cooling system in FIG. 1 when a cover is opened.

Referring to FIGS. 1 to 3, where FIG. 1 is a perspective view of a cooling system 10 according to a first embodiment of the invention, FIG. 2 is another perspective view of the cooling system 10 in FIG. 1, and FIG. 3 is a perspective view of the cooling system 10 in FIG. 1 when a cover 120 is opened.

In this embodiment, the cooling system 10 includes a casing 100 and a first heat dissipation device 210. The casing 100 includes a tank 110 and a cover 120. The tank 110 has an accommodation space S1. The accommodation space S1 is configured to accommodate a coolant (not shown) used for cooling a server (not shown). In detail, the coolant is a liquid substance (or material), that has some characteristics suitable for immersion cooling application, such as low boiling point, high heat-transfer efficiency, high thermal capacity and not electrically conductive (dielectric); that is, in the invention, the coolant is an electrical insulator so that it is suitable for one or more heat sources (not shown) to be immersed therein. The cover 120 is movably mounted on the tank 110. The cover 120 can be closed to cover the accommodation space S1 of the tank 110 or opened to expose the accommodation space S1. As the cover 120 is closed, the cover 120 and the tank 110 form an airtight space S2.

The first heat dissipation device 210 is, for example, a condenser. The first heat dissipation device 210 is mounted on the cover 120 via, for example, screws (not shown). When the cover 120 is closed to cover the accommodation space S1 of the tank 110, the first heat dissipation device 210 is located within the airtight space S2, such that the first heat dissipation device 210 is able to condense the vapor coolant and, hence, takes the heat away.

In this embodiment, the cooling system 10 may, for example, include a hinge assembly 300. The hinge assembly 300 includes a first hinge component 310 and a second hinge component 320. The first hinge component 310 is fixed on the tank 110, and the second hinge component 320 is fixed on the cover 120. The second hinge component 320 and the first hinge component 310 are pivotably connected to each other via a pivot (not shown), such that the cover 120 is pivotable with respect to the tank 110.

In this embodiment, the tank 110 may, for example, include a first accommodation portion 111 and a second accommodation portion 112. The first accommodation portion 111 surrounds a liquid storage area S11 of the accommodation space S1 and an opening O is connected to the liquid storage area S11. The second accommodation portion 112 is connected to the first accommodation portion 111 and surrounds a vapor storage area S12 of the accommodation space S1. The vapor storage area S12 is connected to the liquid storage area S11 via the opening O. A length L2 and a width W2 of the second accommodation portion 112 are larger than a length L1 and a width W1 of the first accommodation portion 111.

The cover 120 is movably mounted on the second accommodation portion 112 of the tank 110. The cover 120 may, for example, include an outer portion 121 and an inner portion 122. The outer portion 121 is connected to a periphery of the inner portion 122. The inner portion 122 protrudes from the outer portion 121, and the inner portion 122 is located closer to the first accommodation portion 111 than the outer portion 121 (as shown in FIG. 7).

In this embodiment, the inner portion 122 of the cover 120 may, for example, includes a transportation port 1221. The transportation port 1221 is connected to the first heat dissipation device 210. A tube (not shown) can be connected to the first heat dissipation device 210 via the transportation port 1221, and the tube can be moved with the cover 120 and will not be tangled with the cover 120.

Figure 4:
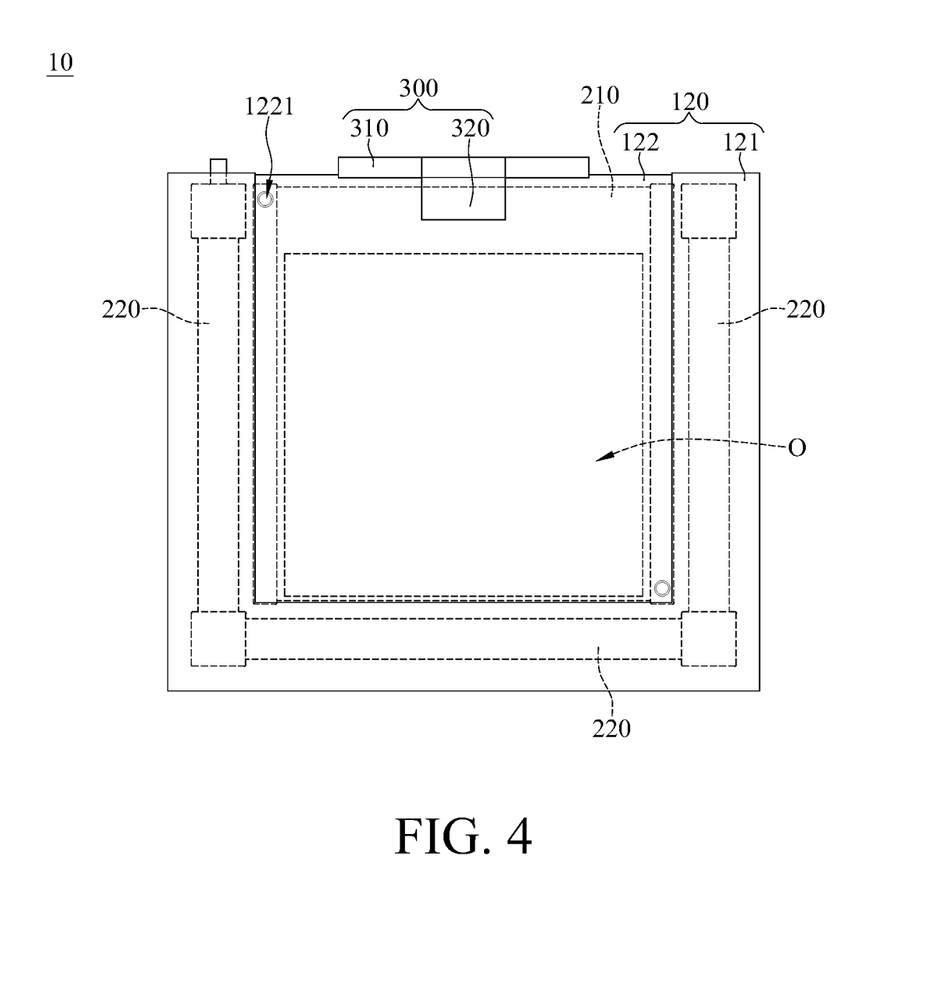
FIG. 4 is a top view of the cooling system in FIG. 1.
Figure 5:
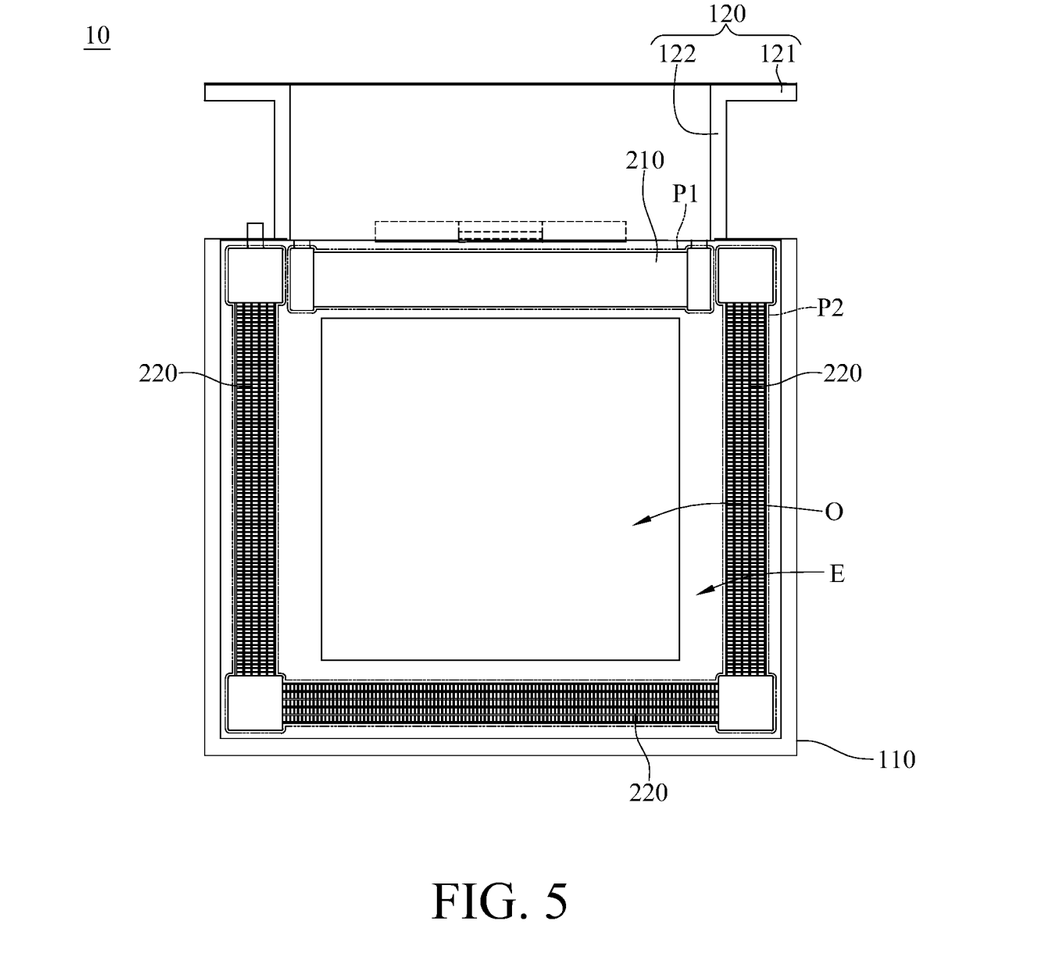
FIG. 5 is a top view of the cooling system in FIG. 3.
Figure 6:
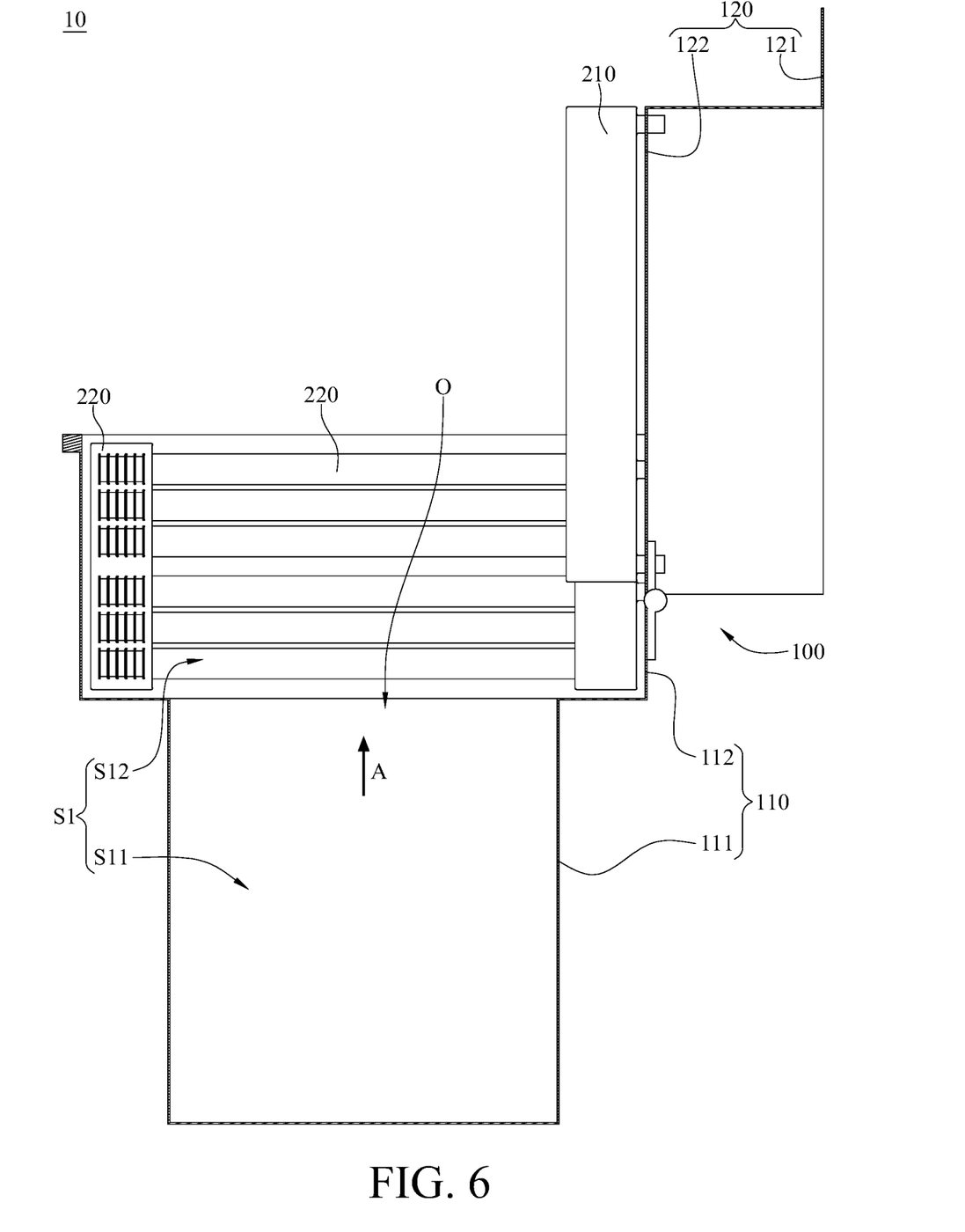
FIG. 6 is a lateral view of the cooling system in FIG. 3.
Figure 7:
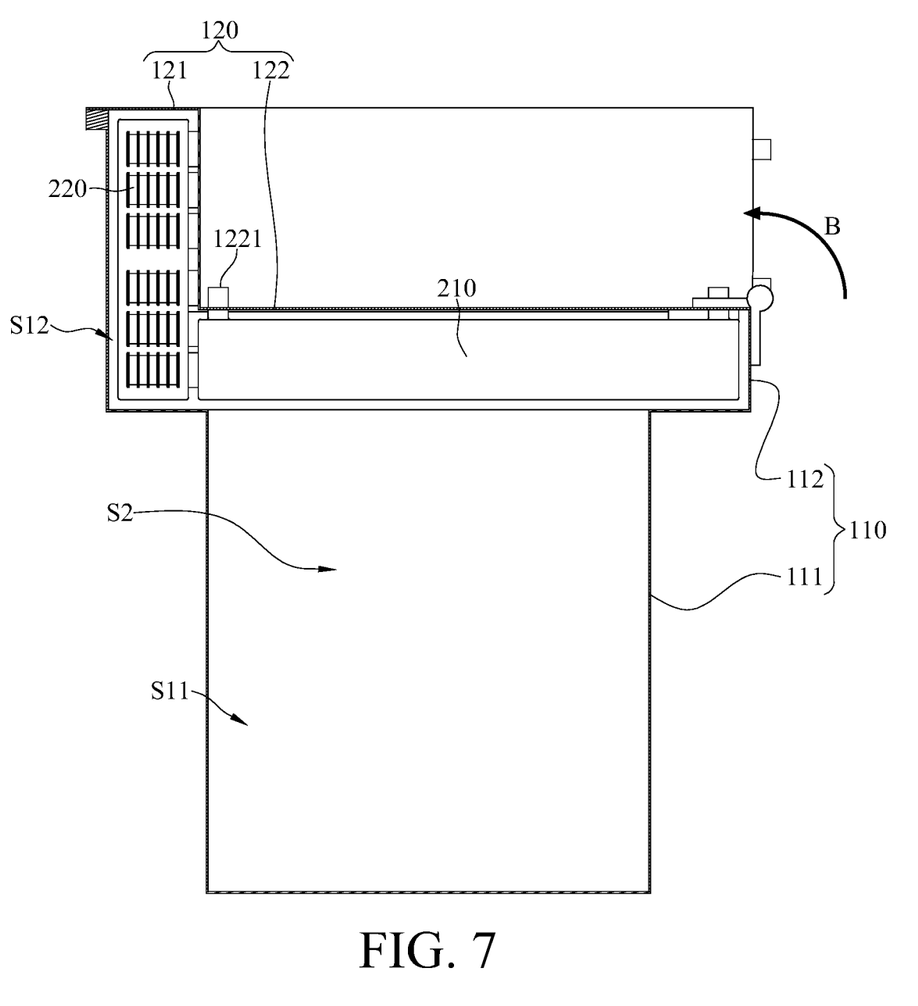
FIG. 7 is a lateral view of the cooling system in FIG. 1.

Referring to FIGS. 4 to 7, where FIG. 4 is a top view of the cooling system 10 in FIG. 1, FIG. 5 is a top view of the cooling system 10 in FIG. 3, FIG. 6 is a lateral view of the cooling system 10 in FIG. 3, and FIG. 7 is a lateral view of the cooling system 10 in FIG. 1.

As shown in FIGS. 4 and 5, the cooling system 10 further includes a plurality of second heat dissipation devices 220. The second heat dissipation devices 220 are located at the periphery of the inner portion 122 and a periphery of the first heat dissipation device 210. In addition, the second heat dissipation devices 220 are located at a side of the outer portion 121 close to the first accommodation portion 111. Furthermore, the second heat dissipation devices 220 are located in the vapor storage area S12, and orthogonal projections of the second heat dissipation devices 220 on a plane E where the opening O is located are located outside the opening O.

As shown in FIG. 5, in this embodiment, every adjacent two of the second heat dissipation devices 220 are connected to each other, but the present invention is not limited thereto; in some other embodiments, the second heat dissipation devices may be spaced apart from one another.

Note that the quantity of the second heat dissipation devices 220 is not restricted. In some other embodiments, there may be only one second heat dissipation device in the cooling system.

In this embodiment, defining that the cover 120 is pivotable between a closed position (as shown in FIGS. 4 and 7) and an opened position (as shown in FIGS. 5 and 6).

As shown in FIGS. 5 and 6, when cover 120 is in the opened position, an orthogonal projection P1 of the first heat dissipation device 210 on the plane E where the opening O is located is located outside the opening O, and the orthogonal projection P1 of the first heat dissipation device 210 and the orthogonal projections P2 of the second heat dissipation devices 220 on the plane E of the opening O together surround the opening O. Therefore, the first heat dissipation device 210 and the second heat dissipation devices 220 do not directly block the opening O, and this arrangement allows maintenance personnel to reach and maintain the heat source through the opening O. Meanwhile, since the orthogonal projections P1 and P2 of the first heat dissipation device 210 and the second heat dissipation devices 220 surround the opening O, the arrangement of the first heat dissipation device 210 and the second heat dissipation devices 220 is able to condense the vapor coolant to reduce the escape of the vapor coolant while the cover 120 is opened.

Then, as shown in FIGS. 4 and 7, when the cover 120 is pivoted to the closed position along a direction B, the orthogonal projection of the first heat dissipation device 210 on the plane E (shown in FIG. 5) substantially overlaps with the opening O, such that the vapor coolant flowing upward along a direction A can be directly condensed by the first heat dissipation device 210 located right above the opening O.

Figure 8:
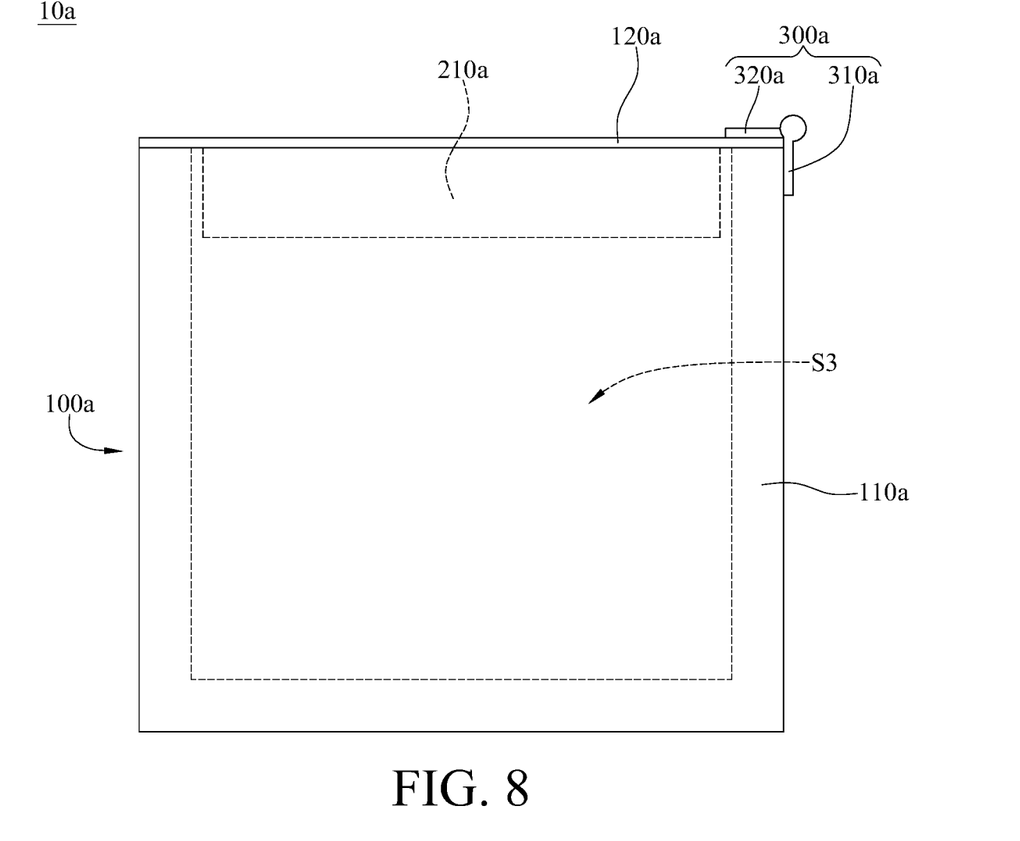
FIG. 8 is a perspective view of a cooling system according to a second embodiment of the invention.

In the aforementioned embodiment, the forms of the tank 110 and the cover 120 are not restricted. Referring to FIG. 8, there is shown a perspective view of a cooling system 10a according to a second embodiment of the invention.

In this embodiment, the cooling system 10a includes a casing 100a and a first heat dissipation device 210a. The casing 100a includes a tank 110a and a cover 120a. The tank 110a is, for example, a cube and configured to accommodate a coolant (not shown) which is used for cooling a server (not shown). The cover 120a is movably mounted on the tank 110a, and the cover 120a covers the tank 110a. The cover 120a and the tank 110a form an airtight space S3. The first heat dissipation device 210a is, for example, a condenser. The first heat dissipation device 210a is mounted on the cover 120a via, for example, screws (not shown). When the cover 120a covers the tank 110a, the first heat dissipation device 210a is located within the airtight space S3, such that the first heat dissipation device 210a is able to condense the vapor coolant and, hence, takes the heat away.

According to the cooling systems as discussed above, the first heat dissipation device is fixed on the cover, and the cover can be moved with respect to the tank, and thus the first heat dissipation device can be located right above the opening, or leave the place located above the opening as the cover is moved with respect to the tank. Therefore, the condensation efficiency of the vapor coolant can be increased when the first heat dissipation device is located right above the opening, and does not block or interfere the maintenance of the heat source located in the tank when the cover is moved away.

In addition, the cover is pivotably disposed on the tank, such that the cover can be pivoted to the opened position, and the orthogonal projections of the first heat dissipation device and the second heat dissipation devices on the plane where the opening is located together surround the opening. Therefore, the first heat dissipation device and the second heat dissipation devices does not block the opening, and this arrangement allows maintenance personnel to reach and maintain the heat source through the opening. Meanwhile, since the orthogonal projections of the first heat dissipation device and the second heat dissipation devices together surround the opening, the arrangement of the first heat dissipation device and the second heat dissipation devices is able to condense the vapor coolant to reduce the escape of the vapor coolant while the cover is opened.

The cooling systems according to the aforementioned embodiments of the invention may also be applied to different computer architectures, such as an internet communication device, an industrial computer, a server, or a peripheral device thereof. Moreover, the cooling systems may further be applied to an artificial intelligence computing device, an edge computing device, a cloud computing server, a cloud storage server, a 5G server or a server for internet of vehicles.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A cooling system for a server, comprising:
   a casing, comprising a tank and a cover, wherein the tank has an accommodation space, the cover is movably mounted on the tank, the cover comprises an outer portion and an inner portion, and the cover covers the accommodation space so as to form an airtight space with the tank;
   a first heat dissipation device, mounted on the cover and located within the airtight space of the casing; and
   at least one second heat dissipation device, located at a periphery of the inner portion and a periphery of the first heat dissipation device.

2. The cooling system according to claim 1, wherein the tank comprises a first accommodation portion and a second accommodation portion, the first accommodation portion surrounds a liquid storage area of the accommodation space and an opening is connected to the liquid storage area, the second accommodation portion is connected to the first accommodation portion and surrounds a vapor storage area of the accommodation space, the vapor storage area is connected to the liquid storage area via the opening, a length and a width of the second accommodation portion are larger than a length and a width of the first accommodation portion, the cover is movably mounted the second accommodation space portion of the tank, the at least one second heat dissipation device is located in the vapor storage area, and an orthogonal projection of the at least one second heat dissipation device on a plane where the opening is located is located outside the opening.

3. The cooling system according to claim 2, wherein the outer portion is connected to the periphery of the inner portion, the inner portion protrudes from the outer portion, the inner portion is located closer to the first accommodation portion than the outer portion, the at least one second heat dissipation device is located at a side of the outer portion close to the first accommodation portion.

4. The cooling system according to claim 3, wherein the quantity of the at least one second heat dissipation device is plural.

5. The cooling system according to claim 4, wherein every adjacent two of the second heat dissipation devices are connected to each other.

6. The cooling system according to claim 4, wherein the cover is pivotably disposed on the tank.

7. The cooling system according to claim 6, wherein the cover is pivotable between a closed position and an opened position with respect to the tank; when the cover is in the closed position, an orthogonal projection of the first heat dissipation device on the plane where the opening is located substantially overlaps with the opening; when the cover is in the opened position, the orthogonal projection of the first heat dissipation device on the plane where the opening is located is located outside the opening, and the orthogonal projection of the first heat dissipation device and the orthogonal projections of the second heat dissipation devices on the plane where the opening is located surround the opening together.

8. The cooling system according to claim 6, further comprising a hinge assembly, wherein the hinge assembly comprising a first hinge component and a second hinge component, the first hinge component is fixed on the tank, the second hinge component is fixed on the cover, the second hinge component is pivotably disposed on the first hinge component via a pivot, such that the cover is pivotable with respect to the tank.

9. The cooling system according to claim 1, wherein the cover comprises a transportation port, the transportation port is connected to the first heat dissipation device.

10. The cooling system according to claim 1, wherein the cover is pivotably disposed on the tank.

\* \* \* \* \*